United States Patent
Liao et al.

(10) Patent No.: US 8,455,883 B2
(45) Date of Patent: Jun. 4, 2013

(54) STRESSED SEMICONDUCTOR DEVICE AND METHOD OF MANUFACTURING

(75) Inventors: Miao-Cheng Liao, Tsztung Shiang (TW); Min Hao Hong, Kaohsiung (TW); Hsiang Hsiang Ko, Sinying (TW); Kei-Wei Chen, Tainan (TW); Ying-Lang Wang, Tai-Chung County (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 60 days.

(21) Appl. No.: 13/111,732

(22) Filed: May 19, 2011

(65) Prior Publication Data

US 2012/0292639 A1  Nov. 22, 2012

(51) Int. Cl.
*H01L 29/15*  (2006.01)
*H01L 31/052*  (2006.01)
*H01L 21/331*  (2006.01)

(52) U.S. Cl.
USPC ....... 257/77; 257/294; 257/E27.046; 438/378

(58) Field of Classification Search
CPC ............................ H01L 21/331; H01L 31/052
USPC ................. 257/77, 294, E27.046; 438/199, 438/700, 795, 796, 222, 308, 378
See application file for complete search history.

(56) References Cited

U.S. PATENT DOCUMENTS

| | | | |
|---|---|---|---|
| 4,256,514 A | 3/1981 | Pogge | |
| 4,942,137 A | 7/1990 | Sivan et al. | |
| 5,387,538 A | 2/1995 | Moslehi | |
| 5,930,646 A | 7/1999 | Gerung et al. | |
| 6,306,723 B1 | 10/2001 | Chen et al. | |
| 6,576,530 B1 | 6/2003 | Chen et al. | |
| 6,784,077 B1 | 8/2004 | Lin et al. | |
| 7,538,009 B2 | 5/2009 | Kim | |
| 2006/0105106 A1* | 5/2006 | Balseanu et al. | 427/248.1 |
| 2007/0281446 A1* | 12/2007 | Winstead et al. | 438/478 |
| 2008/0026487 A1* | 1/2008 | Feustel et al. | 438/7 |

OTHER PUBLICATIONS

Kiyohisa Fujinaga, Electrical Investigation of Si/SiGe Layers Grown on a Nanometer-Thick SOI by CVD, Electrochemical and Solid-State Letters, 7 (11) G276-G278 (2004).

* cited by examiner

*Primary Examiner* — Nikolay Yushin
(74) *Attorney, Agent, or Firm* — Haynes and Boone, LLP

(57) ABSTRACT

A semiconductor device and method of manufacturing a semiconductor device is disclosed. The exemplary semiconductor device and method for fabricating the semiconductor device enhance carrier mobility. The method includes providing a substrate and forming a dielectric layer over the substrate. The method further includes forming a first trench within the dielectric layer, wherein the first trench extends through the dielectric layer and epitaxially (epi) growing a first active layer within the first trench and selectively curing with a radiation energy the dielectric layer adjacent to the first active layer.

20 Claims, 8 Drawing Sheets

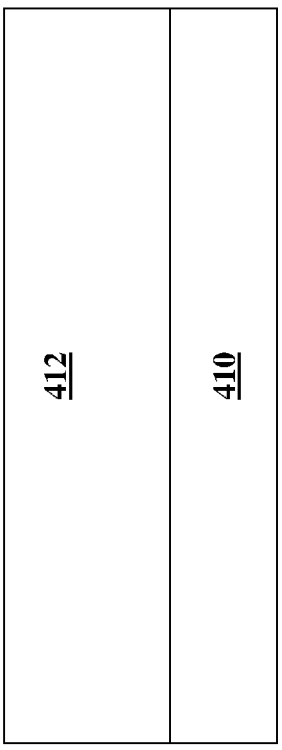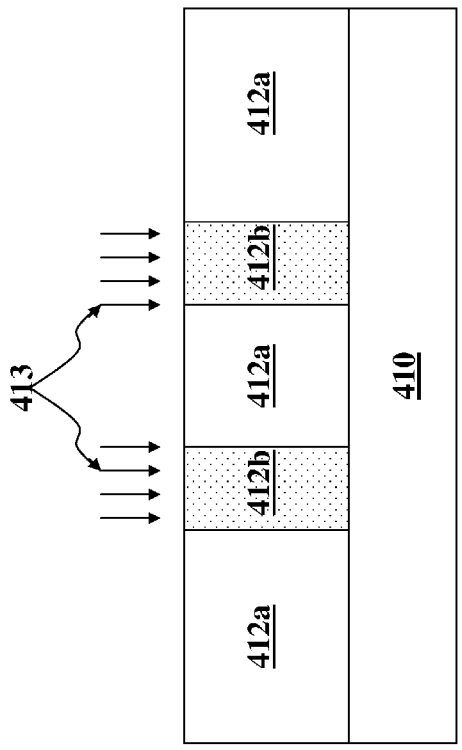

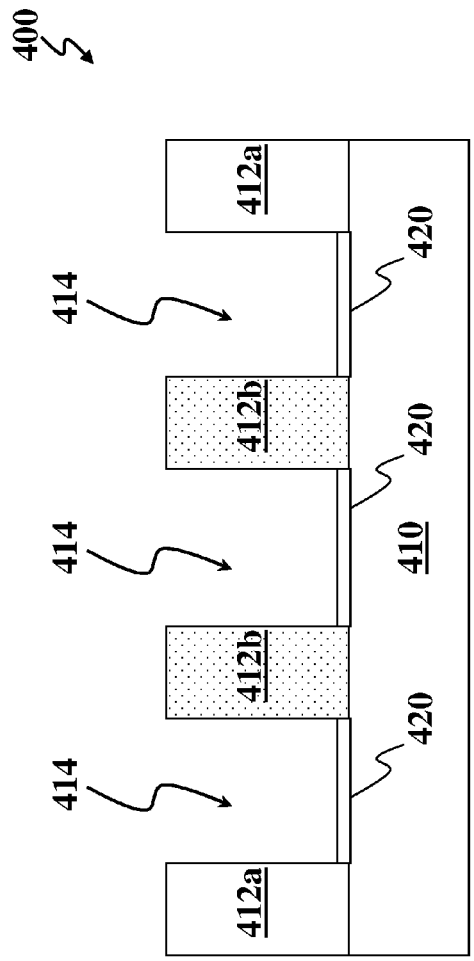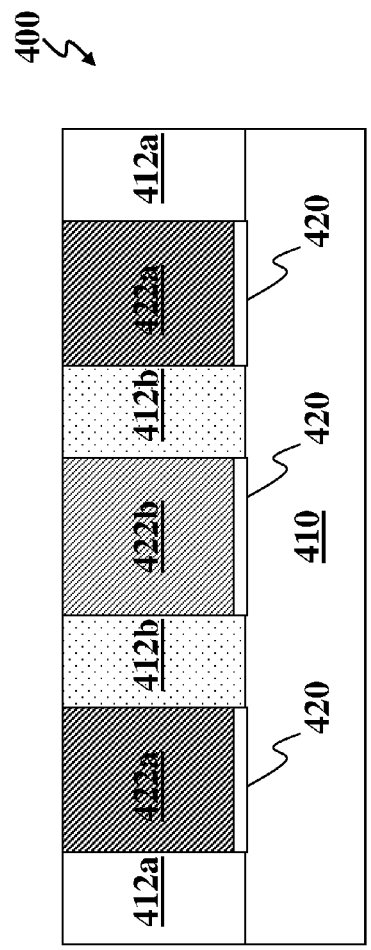

STRESSED SEMICONDUCTOR DEVICE AND METHOD OF MANUFACTURING

BACKGROUND

The semiconductor integrated circuit (IC) industry has experienced rapid growth. Technological advances in IC materials and design have produced generations of ICs where each new generation has smaller and more complex circuits than the previous generation. These advances, however, have increased the complexity of processing and manufacturing ICs and, for these advances to be realized, similar developments in IC processing and manufacturing are needed. In the course of integrated circuit evolution, functional density (i.e., the number of interconnected devices per chip area) has generally increased while geometry size (i.e., the smallest component or line that can be created using a fabrication process) has decreased. This scaling-down process generally provides benefits by increasing production efficiency and lowering associated costs. During the scaling trend, it has been desirable to improve performance of field effect transistors (FETs). One method to improve FET performance is to enhance the carrier mobility within the channel region, which is the region between the source and the drain of the FET. Although existing approaches had initially addressed some performance concerns, with continued device down scaling, they have not been entirely satisfactory in all respects. Accordingly, there is a need for an improved fabrication process (and resulting device).

BRIEF DESCRIPTION OF THE DRAWINGS

The present disclosure is best understood from the following detailed description when read with the accompanying figures. It is emphasized that, in accordance with the standard practice in the industry, various features are not drawn to scale and are used for illustration purposes only. In fact, the dimensions of the various features may be arbitrarily increased or reduced for clarity of discussion.

FIGS. 8-11 are diagrammatic cross-sectional views of a semiconductor device at various fabrication stages of fabrication according to the method of FIG. 7.

DETAILED DESCRIPTION

Figure 1:
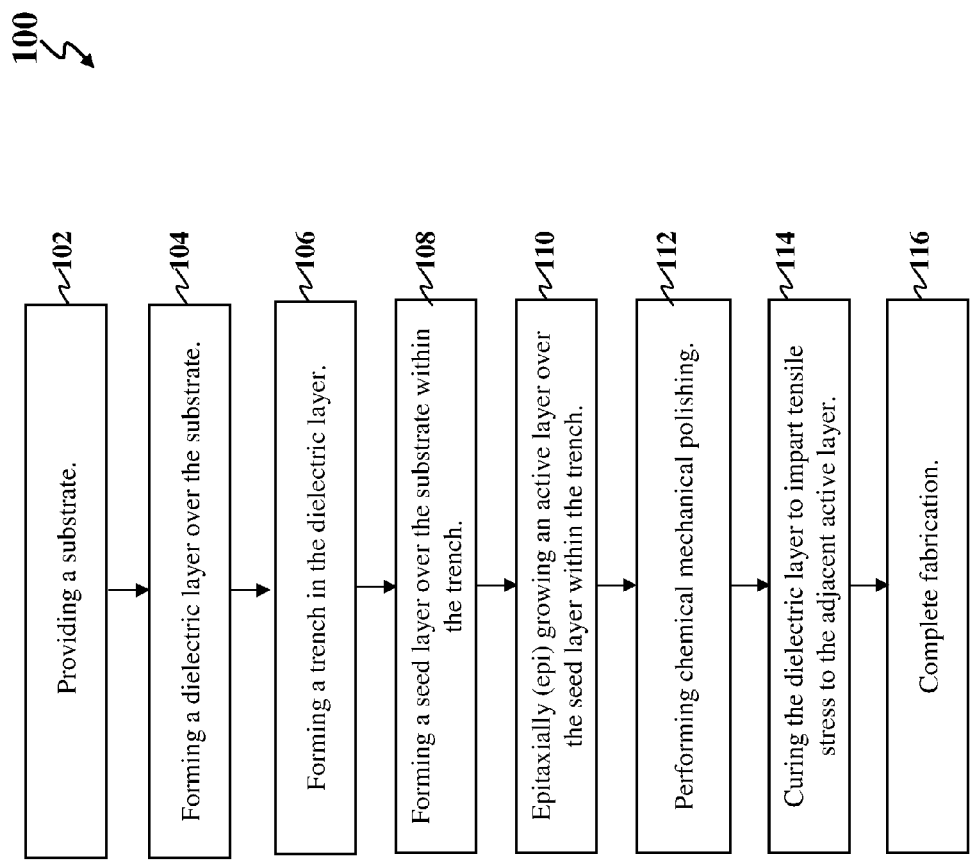
FIG. 1 is a flow chart of a method for fabricating a semiconductor device according to various aspects of the present disclosure.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed. It is understood that those skilled in the art will be able to devise various equivalents that, although not explicitly described herein, embody the principles of the present invention.

Turning now to the figures, FIG. 1 is a flow chart of a method 100 for fabricating a semiconductor device according to one embodiment of the present disclosure. The method 100 begins at block 102 where a substrate is provided. At block 104, a dielectric layer is formed over the substrate. At block 106, trenches are formed in the dielectric layer. The method continues with block 108 where a seed layer is formed over the substrate within the trench. At block 110, an active layer is epitaxially (epi) grown over the seed layer within the trench. At block 112, a chemical mechanical polishing process is performed to planarize the top of the semiconductor device. At block 114, a curing of the dielectric layer takes place. In the present embodiment, the curing of the dielectric layer imparts tensile stress to the adjacent active layer. The method 100 continues with block 116 where fabrication of the semiconductor device is completed. Additional steps can be provided before, during, and after the method 100, and some of the steps described can be replaced or eliminated for other embodiments of the method. The discussion that follows illustrates various embodiments of a semiconductor device that can be fabricated according to the method 100 of FIG. 1.

Figure 2:
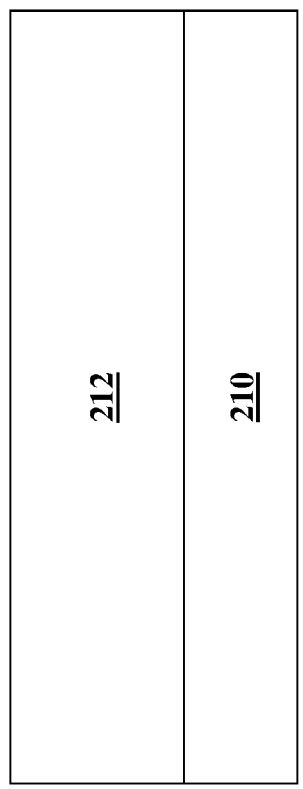
FIGS. 2-5 are diagrammatic cross-sectional views of a semiconductor device at various fabrication stages of fabrication according to the method of FIG. 1.

FIGS. 2-5 illustrate diagrammatic cross-sectional views of a semiconductor device at various fabrication stages of fabrication according to the method of FIG. 1. It is understood that FIGS. 2-5 have been simplified for the sake of clarity to better understand the inventive concepts of the present disclosure. Referring now to FIG. 2, the semiconductor device 200 includes a substrate 210. The substrate 210 may be formed, for example, of an elemental semiconductor material such as silicon (Si) or germanium (Ge), or an alloy semiconductor such as silicon germanium (SiGe) or silicon carbide (SiC), or a compound semiconductor such as gallium arsenide or indium phosphide, or other suitable semiconductor materials. In accordance with some embodiments, the substrate 210 may be formed of a dielectric material which may include silicon nitride (SiN) or other suitable dielectric materials.

A dielectric layer 212 is formed over the substrate 210. The dielectric layer 212 may be formed of dielectric materials having good compressive stress characteristics. Embodiments and examples in accordance with the present disclosure are described mainly with reference to compressive dielectric layers comprising silicon nitride. Silicon nitride material often is represented by the chemical formula $Si_3N_4$. In this specification, silicon nitride is represented by the general chemical formula SiN, which includes $Si_3N_4$ as well as other silicon nitride species. Factors such as temperature, power, gas flow rate, and spacing may be controlled to form the dielectric layer 212 with the desired stress characteristics. For example, the stress of the SiN dielectric layer 212 may be tuned by a deposit process having a temperature ranging from about 200 degrees Celsius to about 500 degrees Celsius, a deposit RF Power ranging from about 100 Watts to about 1000 Watts, a flow rate ranging from about 20 sccm to about 200 sccm and a spacing ranging from about 100 mil to about 500 mil. The dielectric layer 212 may have a thickness ranging from about 1000 Angstroms to about 3000 Angstroms.

Figure 3:
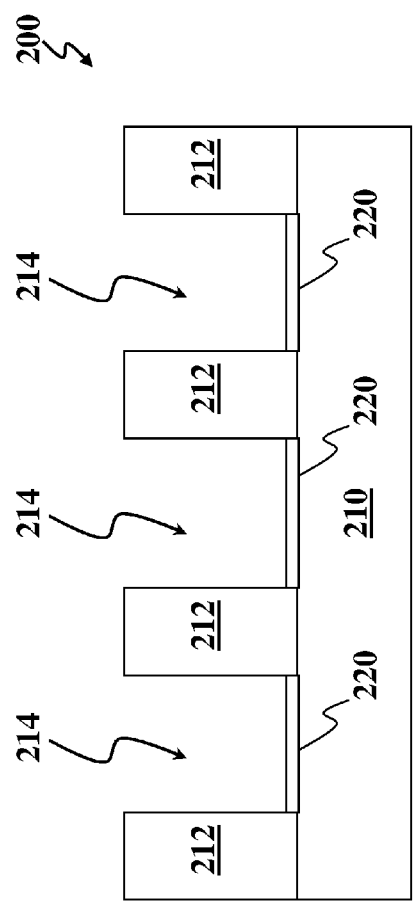

Referring now to FIG. 3, a trench region 214 is formed by an etching process. In the present embodiment, the etching process includes a dry etching process, a wet etching process, or a combination of dry and wet etching process to remove portions of the dielectric layer 212 and thereby form the trench regions 214. The dry etching process, for example, utilizes a pressure ranging from about 5 mTorr to about 15 mTorr, a power ranging from about 300 Watts to about 900 Watts, HBr having a flow rate ranging from about 100 sccm to about 400 sccm, O2/He having a flow rate ranging from about 10 sccm to 40 sccm, Cl2 having a flow rate ranging from about 20 sccm to about 60 sccm, and NF3 having a flow rate ranging from about 1 sccm to about 20 sccm. The etching process may use a hard mask layer, an anti-reflective layer, and a photoresist mask layer, the formation and composition of which are well known in the art.

With further reference to FIG. 3, after forming the trench region 214, in accordance with one embodiment, a seed layer 220 may be formed over the substrate 210 within the trench region 214. The seed layer 220 has a thickness of about 2 Angstroms to about 50 Angstroms. Due to its crystal structure, the seed layer 220 is formed by a "bottom up" process. The seed layer 220 may be formed, for example, of silicon (Si) using a chemical-vapor-deposition (CVD) process. The CVD process may use a precursor of SiH4 (Silane), SiH3Cl (Chlorosilane), SiH2Cl2 (Dichlorosilane), SiHCl3 (Trichlorosilane), SiCl4 (Tetrachlorosilane), Si2H6 (Disilane), and other materials with similar properties. During the formation of the seed layer 220, factors such as pressure, temperature and gas phase ratio for silicon (Si) may be used to tune the seed layer 220. For example, the pressure may have a range from about 0 Atmosphere to about 1 Atmosphere, the temperature may have a range from 400 degrees C. to about 1300 degrees C., and the gas phase ratio HCl/Si may have a range from about 0 to about 1. In certain embodiments, the formation of the seed layer 220 may help to facilitate epitaxially (epi) growing a semiconductor material within the trench region 214 over the substrate 210. In such embodiments, the substrate 210 may include a dielectric material.

Figure 4:
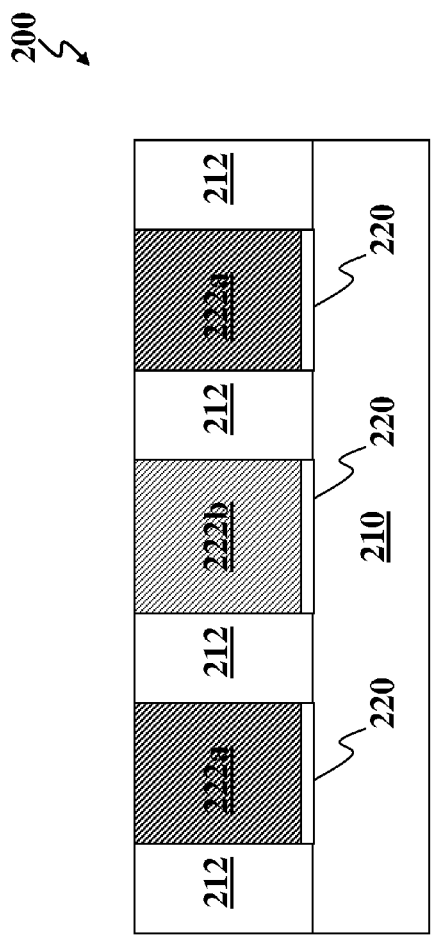

In FIG. 4, a semiconductor material is deposited within the trench region 214 to form strained structures (an active layer 222a and an active layer 222b) of the semiconductor device 200. The material of active layer 222a and active layer 222b may be different from the substrate 210. In such embodiments, active layer 222a and active layer 222b are stressed to enable carrier mobility of the semiconductor device and thereby enhance performance. The active layer 222a and active layer 222b may be epitaxially (epi) grown. The epitaxy process, for example, may use CVD deposition techniques (e.g., Atmospheric pressure CVD (AP-CVD)/Reduced pressure CVD (RP-CVD)/Low pressure CVD (LP-CVD)/vapor-phase epitaxy (VPE) and/or ultra-high vacuum CVD (UHV-CVD)), molecular beam epitaxy, Metal-organic Chemical Vapor Deposition (MOCVD), and/or other suitable processes. Furthermore, the epitaxy process may use gaseous and/or liquid precursors.

In one embodiment of the present disclosure, the material of the active layer 222a is the same as the material of the active layer 222b. This may be desirable in order to lower cost during the manufacturing process by reducing steps. For example, the material of the active layer 222a and the material of the active layer 222b may be silicon germanium (SiGe). In another embodiment, the material of the active layer 222a is different than the material of the active layer 222b. This may be desirable to optimize the performance of the active layer for both p-type metal-oxide-semiconductor field-effect transistor (PMOS) and n-type metal-oxide-semiconductor field-effect transistor (NMOS) devices. For example, the active layer 222a may be formed by selectively depositing epitaxial silicon carbide (SiC) or silicon germanium (SiGe) within the selected trench region 214 to form the active layer of a PMOS device and the active layer 222b may be formed by selectively depositing epitaxial silicon germanium (SiGe) within the selected trench region 214 to form the active layer of a NMOS device. In one embodiment, the active layer 222a and the active layer 222b are formed by depositing epitaxial silicon directly over the substrate 210 within the trench region 214 (i.e., there is no seed layer 220). In an alternative embodiment, the active layer 222a and the active layer 222b are formed by depositing epitaxial silicon directly over the seed layer 220 within the trench region 214.

In certain embodiments of the present disclosure, the stress of the active layer 222a is different from the stress of the active layer 222b. In other embodiments, the stress of the active layer 222a is the same as the stress of the active layer 222b. The stress of the active layer 222a may be tuned, for example, by controlling the carbide (C) concentration of the silicon carbice (SiC) material or by controlling the germanium (Ge) concentration of the silicon germanium (SiGe) material. Likewise, the stress of the active layer 222b may be tuned, for example, by controlling the germanium (Ge) concentration of the silicon germanium (SiGe) material. For example, silicon germanium (SiGe) my have a concentration range of 0% to 100% germanium (Ge) and silicon carbide (SiC) may have a concentration range of 0% to 100% carbide (C). Although the above example discloses silicon germanium (SiGe) and silicon carbide (SiC), the active layer 222a and active layer 222b may include other suitable semiconductor materials. After the formation of the active layer 222a and active layer 222b, a chemical mechanical polishing (CMP) process is used to planarize the semiconductor device.

Figure 5:
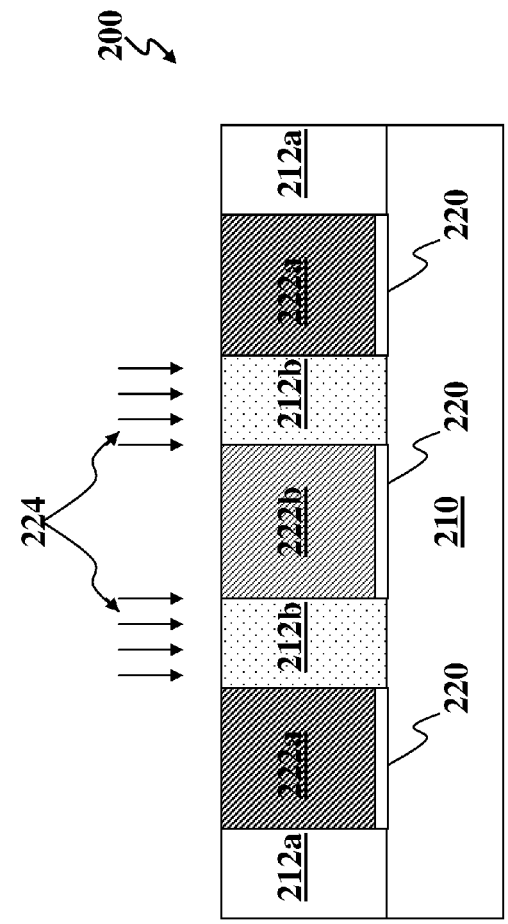

In FIG. 5, the dielectric layer 212 which is adjacent to the active layer 222b is selectively cured by a curing process 224. The non-cured dielectric layer 212 is denoted by 212a while the cured dielectric layer is denoted by 212b. The curing process 224 may include using a photoresist mask to select regions to be cured. The curing process 224 increases the stress of the cured dielectric layer 212b as compared to that before the curing by removing hydrogen; thereby causing shrinking of the dielectric material when it recrystallizes. For example, before the curing process 224 the hydrogen concentration (Si—H and Si—N) of the dielectric layer 212 is 2.4E17 atom/cm$^2$ (+−1.0 E17) and after the curing process 224 the hydrogen concentration (Si—H and Si—N) of the dielectric layer 212 is 1.1E17 atom/cm$^2$ (+−1.0 E17). The shrinking of the cured dielectric layer 212b induces tensile stress to the adjacent active layer 222b. The curing process 224 may change the tensile stress within the active layer 222b from about 100 Mpa to about 500 MPa before the curing process 224 to about 0.5 GPa to about 2 GPa after the curing process 224.

In accordance with one embodiment of the present disclosure, the curing process 224 may be performed by irradiating the dielectric layer 212b with ultraviolet rays, by electron beam curing, or by laser curing. For ultraviolet curing, the process may include using a irradiation apparatus that can control a curing chamber to a predetermined environment for a predetermined period of time. The ultraviolet curing, for example, is performed using an ultraviolet energy between about 100 W/m$^2$ and about 5000 W/m$^2$, a wavelength of about 200 nm to about 500 nm, a temperature of about 300 degrees C. to about 500 degrees C., and a treatment time of about 2 minutes to about 20 minutes. The ultraviolet curing may include process gases such as nitrogen, argon, helium or normal air.

Figure 6:
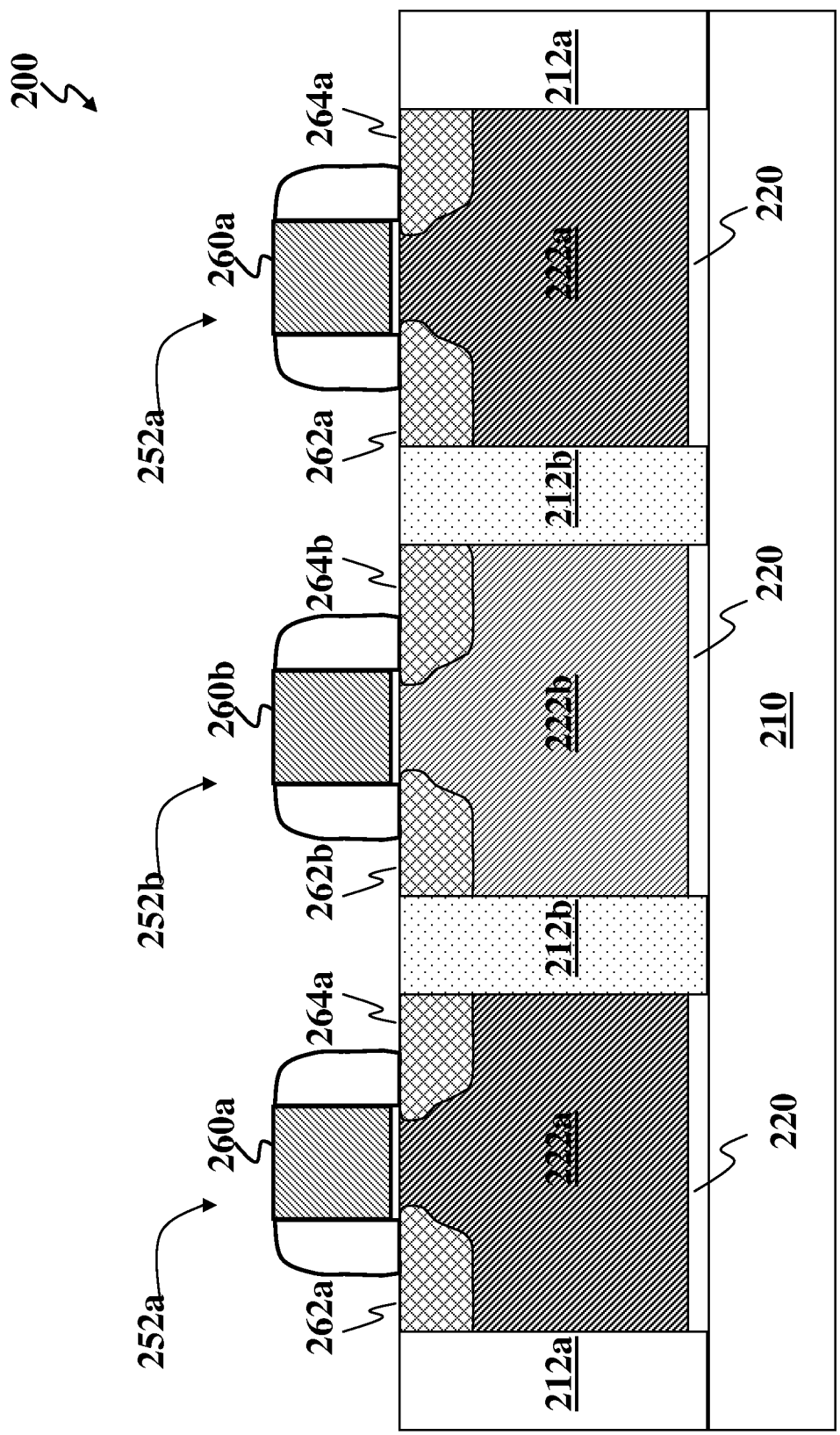
FIG. 6 is a diagrammatic cross-sectional view of a semiconductor device, according to various aspects of the present disclosure.

The semiconductor device continues with fabrication as briefly discussed below. FIG. 6 is a diagrammatic cross-sectional view of a semiconductor device 200, according to various aspects of the present disclosure. The semiconductor device 200 is represented as a complementary metal-oxide-semiconductor field-effect transistor (CMOS) structure having a n-type metal-oxide-semiconductor field-effect transistor (PMOS) structure 252a and a p-type metal-oxide-semiconductor field-effect transistor (NMOS) structure 252b. The PMOS structure 252a may be formed, for example, using the active layer 222a and the NMOS structure 252b may be formed, for example, using the active layer 222b. The PMOS structure 252a and the NMOS structure 252b are isolated by the dielectric layers 212a and 212b. The PMOS structure 252a includes a gate electrode 260a, a source region 262a and a drain region 264a on both sides of the gate electrode 260a, and a channel which is the region between the source region 262a and the drain region 264a. The NMOS structure 252b includes a gate electrode 260b, a source region 262b and a drain region 264b on both sides of the gate electrode 260b, and a channel which is the region between the source region 262b and the drain region 264b.

The non-cured dielectric layer 212a induces compressive stress to the adjacent active layer 222a and the channel region of the PMOS structure 252a on one side and the dielectric layer 212b, which has been cured, induces tensile stress on the other side. The induced stress is in the direction parallel to a surface of the substrate 210 (in-plane tensile stress). The net stress within the channel region of the PMOS structure 252a is compressive. The compressive force applied to the channel region is effective in enhancing hole mobility of the PMOS structure 252a. It is to be understood that although the present embodiment shows the whole dielectric layer 212b as being cured, the curing process may be such that only the part of the dielectric layer 212b which is adjacent to the active layer 222b is cured while the part of the dielectric layer 212b which is adjacent to the active layer 222a remains non-cured. As such, the dielectric layer 212b may only be partially cured.

The dielectric layer 212b stress characteristics, which results from the curing process 224, as disclosed above, induces tensile stress to the adjacent active layer 222b and the channel region of the NMOS structure 252b in the direction parallel to a surface the substrate 210 (in-plane tensile stress). The tensile stress within the channel region, in turn, enhances the electron mobility of the NMOS structure 252b.

Figure 7:
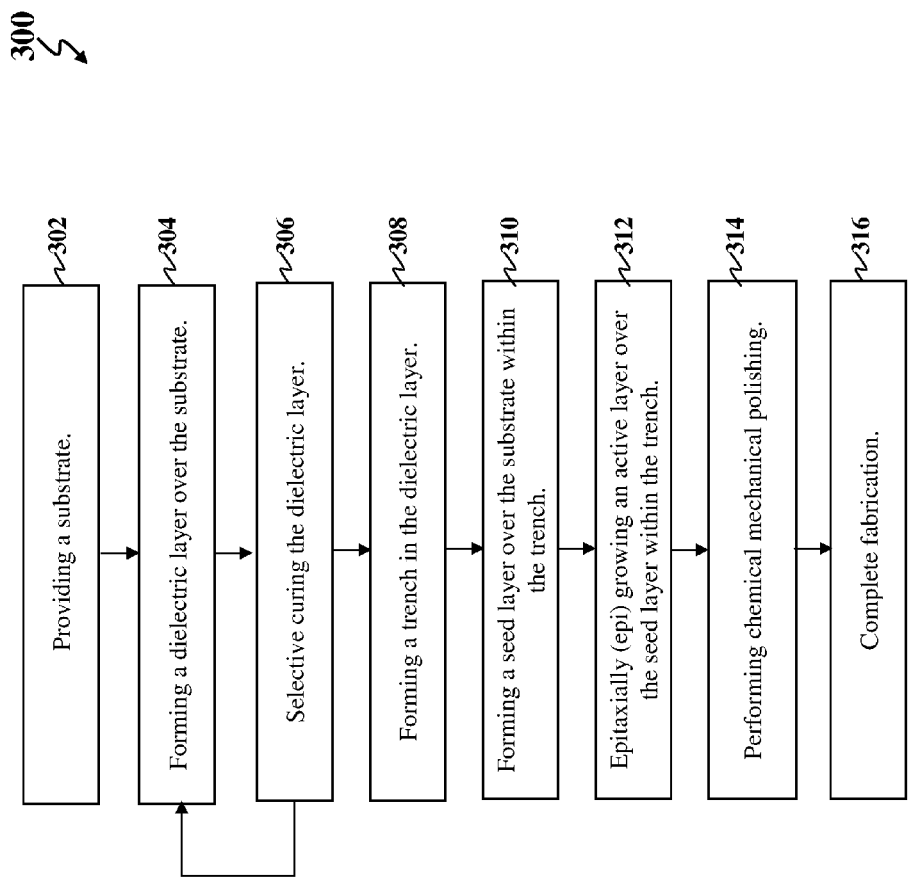
FIG. 7 is a flow chart of an alternative method for fabricating a semiconductor device according to various aspects of the present disclosure.

FIG. 7 is a flow chart of a method 300 for fabricating a semiconductor device according to another embodiment of the present disclosure. The method 300 begins at block 302 where a substrate is provided. At block 304, a dielectric layer is formed over the substrate. At block 306, curing of the dielectric layer takes place. Multiple iterations of forming dielectric layers at block 304 and the curing processes at block 306 may be performed, depending on the desired total thickness of the dielectric layer and the power of the curing process. The method continues with block 308 where trenches are formed in the dielectric layer. At block 310, a seed layer may be formed over the substrate within the trench. At block 312, an active layer is epitaxially (epi) grown over the seed layer within the trench. At block 314, a chemical mechanical polishing (CMP) process is performed on the semiconductor device. The method 300 continues with block 316 where fabrication of the semiconductor device is completed. Additional steps can be provided before, during, and after the method 300, and some of the steps described can be replaced or eliminated for other embodiments of the method. The discussion that follows illustrates various embodiments of a semiconductor device that can be fabricated according to the method 300 of FIG. 7.

FIGS. 8-11 illustrate diagrammatic cross-sectional views of a semiconductor device at various fabrication stages of fabrication according to the method of FIG. 7. Referring now to FIG. 8, a substrate 410 is provided. The substrate 410 may be formed, for example, of an elemental semiconductor material such as silicon (Si) or germanium (Ge), or an alloy semiconductor such as silicon germanium (SiGe) or silicon carbide (SiC), or a compound semiconductor such as gallium arsenide or indium phosphide, or other suitable semiconductor materials. In accordance with another embodiment, the substrate 410 may be formed of a dielectric material which may include silicon nitride (SiN) or other suitable dielectric materials.

With further reference to FIG. 8, a dielectric layer 412 is formed over the substrate 410. The dielectric layer 412 may be formed of dielectric materials having good compressive stress characteristics. Embodiments and examples in accordance with the present disclosure are described mainly with reference to compressive dielectric layers comprising silicon nitride. Silicon nitride material often is represented by the chemical formula Si3N4. In this specification, silicon nitride is represented by the general chemical formula SiN, which includes Si3N4 as well as other silicon nitride species. Factors such as temperature, power, gas flow rate, and spacing may be controlled to form the dielectric layer 412 having the desired stress characteristics. The stress of the SiN dielectric layer 412 may be tuned, for example, by a deposit process having a temperature ranging from about 200 degrees Celsius to about 500 degrees Celsius, a deposit RF Power ranging from about 100 Watts to about 1000 Watts, a flow rate ranging from about 20 sccm to about 200 sccm, and a spacing ranging from about 100 mil to about 500 mil. The dielectric layer 412 may have a thickness in the range of about 1000 Angstroms to about 3000 Angstroms. Where the dielectric layer includes multiple dielectric layers, the thickness of each individual dielectric layer before a curing process 413, which is disclosed below, will vary according to the desired total thickness of the dielectric layer 412 and the ability of the curing process 413 to drive out hydrogen.

In FIG. 9, after the dielectric layer 412 is formed over the substrate 410, the curing process 413 of the dielectric layer 420 takes place. In accordance with one embodiment of the present disclosure, a photoresist mask may be provided over the dielectric layer 412, to selectively cure the dielectric layer 412. The non-cured dielectric layer 412 is denoted by 412a while the cured dielectric layer is denoted by 412b. The curing process 413 increases the stress of the cured dielectric layer 412b as compared to that before the curing by removing hydrogen; thereby causing shrinking of the dielectric material when it recrystallizes. For example, before the curing process 413 the hydrogen concentration (Si—H and Si—N) of the dielectric layer 412 is 2.4E17 atom/cm$^2$ (+−1.0 E17) and after the curing process 413 the hydrogen concentration (Si—H and Si—N) of the dielectric layer 412 is 1.1E17 atom/cm$^2$ (+−1.0 E17). The shrinking of the cured dielectric layer 412b induces tensile stress to the adjacent active layer 422b. The curing process 413 may change the tensile stress within the active layer 422b from about 100 Mpa to about 500 MPa before the curing process 413 to about 0.5 GPa to about 2 GPa after the curing process 413. Multiple iterations of forming the dielectric layer 412 and the curing process 413 may be performed, depending on the desired total thickness of the dielectric layer 412a,b.

In accordance with one embodiment of the present disclosure, the curing process 413 may be performed by irradiating the dielectric layer 412b with ultraviolet rays, by electron beam curing, or by laser curing. For ultraviolet curing, the process may include using a irradiation apparatus that can control a curing chamber to a predetermined environment for a predetermined period of time. The ultraviolet curing may be performed using an ultraviolet energy between about 100 W/m$^2$ and about 5000 W/m$^2$, a wavelength of about 200 nm to about 500 nm, a temperature of about 300 degrees C. to about 500 degrees C., and a treatment time of about 2 minutes to about 20 minutes. The ultraviolet curing may include process gases such as nitrogen, argon, helium or normal air.

Referring now to FIG. 10, after the curing process 413 is performed a trench region 414 is formed by an etching process. In the present embodiment, the etching process includes a dry etching process, a wet etching process, or a combination of dry and wet etching process to remove portions of the dielectric layer 412 and thereby form the trench regions 414. The dry etching process, for example, utilizes a pressure ranging from about 5 mTorr to about 15 mTorr, a power ranging from about 300 Watts to about 900 Watts, HBr having a flow rate ranging from about 100 sccm to about 400 sccm, O2/He having a flow rate ranging from about 10 sccm to 40 about sccm, Cl2 having a flow rate ranging from about 20 sccm to about 60 sccm, and NF3 having a flow rate ranging from about 1 sccm to about 20 sccm. The etching process may use a hard mask layer, an anti-reflective layer, and a photoresist mask layer, the formation and composition of which are well known in the art.

With further reference to FIG. 10, after forming the trench region 414, in accordance with one embodiment of the present disclosure, a seed layer 420 may be formed over the substrate 410 within the trench region 414. The seed layer 420 has a thickness of about 2 Angstroms to about 50 Angstroms. Due to its crystal structure, the seed layer 420 is formed by a "bottom up" process. The seed layer 420 may be formed, for example, of silicon (Si) using a chemical-vapor-deposition (CVD) process. The CVD process may use a precursor of SiH4 (Silane), SiH3Cl (Chlorosilane), SiH2Cl2 (Dichlorosilane), SiHCl3 (Trichlorosilane), SiCl4 (Tetrachlorosilane), Si2H6 (Disilane), and other materials with similar properties. During the formation of the seed layer 420, factors such as pressure, temperature and gas phase ratio may be used to tune the seed layer 420. For example, the pressure may have a range from about 0 Atmosphere to about 1 Atmosphere, the temperature may have a range from about 400 degrees C. to about 1300 degrees C., and the gas phase ratio HCl/Si may have a range from about 0 to about 1. In certain embodiments, the formation of the seed layer 420 may help to facilitate epitaxially (epi) growing a semiconductor material within the trench region 414 over the substrate 410. In such embodiments, the substrate 410 includes a dielectric material.

Referring now to FIG. 11, a semiconductor material is deposited within the trench region 414 to form strained structures (active layer 422a and active layer 422b) of the semiconductor device 400. The material of the active layer 422a and the active layer 422b may be different then that of the substrate 410. In such embodiments, active layer 422a and active layer 422b are stressed to enable carrier mobility of the semiconductor device and thereby enhance performance. The active layer 422a and active layer 422b may be epitaxially (epi) grown. The epitaxy process, for example, may use CVD deposition techniques (e.g., Atmospheric pressure CVD (AP-CVD)/Reduced pressure CVD (RP-CVD)/Low pressure CVD (LP-CVD)/vapor-phase epitaxy (VPE) and/or ultra-high vacuum CVD (UHV-CVD)), molecular beam epitaxy, Metal-organic Chemical Vapor Deposition (MOCVD), and/or other suitable processes. The epitaxy process may use gaseous and/or liquid precursors.

In one embodiment of the present disclosure, the material of the active layer 422a is the same as the material of the active layer 422b. This may be desirable in order to lower cost during the manufacturing process by reducing steps. For example, the material of the active layer 422a and the material for the active region 422b may be silicon germanium (SiGe). In another embodiment, the material of active layer 422a is different than the material of the active layer 422b. This may be desirable to optimize the performance of the active layer for both p-type metal-oxide-semiconductor field-effect transistor (PMOS) and n-type metal-oxide-semiconductor field-effect transistor (NMOS) devices. For example, the active layer 422a may be formed by selectively depositing epitaxial silicon carbide (SiC) or silicon germanium (SiGe) within the selected trench region 414 to form the active layer of a PMOS device and the active layer 422b may be formed by selectively depositing epitaxial silicon germanium (SiGe) within the selected trench region 414 to form the active layer of a NMOS device. In some embodiments, the active layer 422a and the active layer 422b are formed by depositing epitaxial silicon directly over the substrate 410 within the trench region 414 (i.e., there is no seed layer 420). In an alternative embodiment, the active layer 422a and the active layer 422b are formed by depositing epitaxial silicon directly over the seed layer 420 within the trench region 414.

In the present embodiment, the stress of the active layer 422a may be tuned by controlling the carbide (C) concentration of the silicon carbide (SiC) material or by controlling the germanium (G) concentration of the silicon germanium (SiGe) material. Likewise, the stress of the active layer 422b may be tuned, for example, by controlling the germanium (G) concentration of the silicon germanium (SiGe) material. For example, silicon germanium (SiGe) my have a concentration range of 0% to 100% germanium (Ge) and silicon carbide (SiC) may have a concentration range of 0% to 100% carbide (C). Although the above example discloses silicon germanium (SiGe) and silicon carbide (SiC), the active layer 422a and active layer 422b may include other suitable semiconductor materials. After the formation of the active layer 422a and active layer 422b, a chemical mechanical polishing (CMP) process is used to planarize the semiconductor device.

Figure 12:
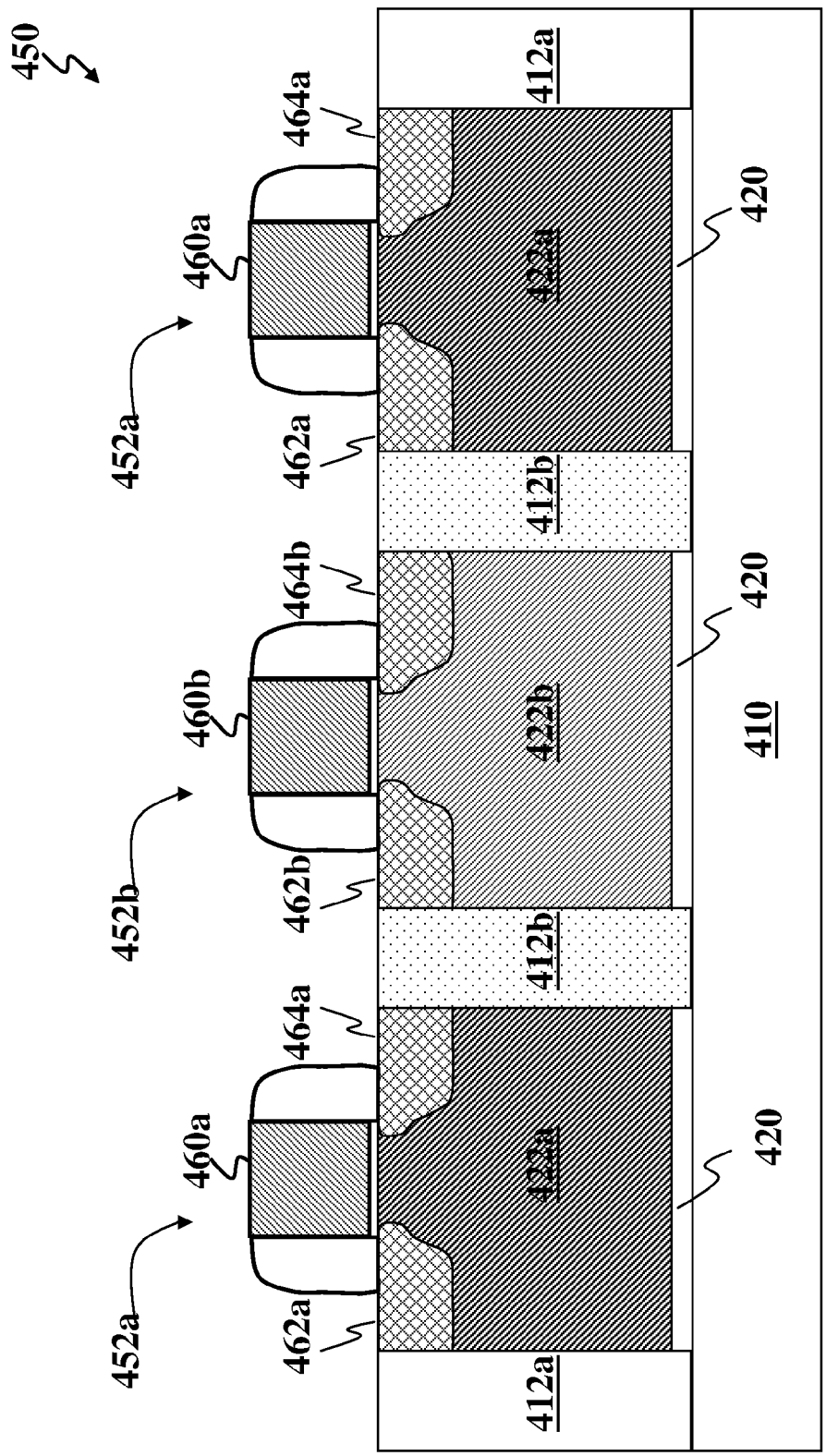
FIG. 12 is a diagrammatic cross-sectional view of a semiconductor device, according to various aspects of the present disclosure.

FIG. 12 is a diagrammatic cross-sectional view of a semiconductor device 400, according to various aspects of the present disclosure. The semiconductor device 400 is represented as a complementary metal-oxide-semiconductor (CMOS) field-effect transistor structure having a p-type metal-oxide-semiconductor field-effect transistor (PMOS) structure 452a and a n-type metal-oxide-semiconductor field-effect transistor (NMOS) structure 452b. The PMOS structure 452a may be formed, for example, using the active layer 422a and the NMOS structure 452b may be formed, for example, using the active layer 422b. The PMOS structure 452a and the NMOS structure 452b are isolated by the dielectric layers 412a and 412b. The PMOS structure 452a includes a gate electrode 460a, a source region 462a and a drain region 464a on both sides of the gate electrode 460a, and a channel which is the region between the source region 462a and the drain region 464a. The NMOS structure 452b includes a gate electrode 460b, a source region 462b and a drain region 464b on both sides of the gate electrode 460b, and a channel which is the region between the source region 462b and the drain region 464b.

The dielectric layer 412a and the dielectric layer 412b isolates the PMOS structure 452a and the NMOS structure 452b. The dielectric layer 412a induces compressive stress to the adjacent active layer 422a and the channel region of the PMOS structure 442a on one side and the dielectric layer 412b induces tensile stress on the other side. The induced stress is in a direction parallel to a surface of the substrate 410 (in-plane tensile stress). The sum of the stress within the channel region of the PMOS structure 452a is compressive. The compressive force applied to the channel region is effective in enhancing hole mobility in the PMOS structure 452a. It is to be understood that although the present embodiment shows the whole dielectric layer 412b as being cured, the curing process may be such that only the part of the dielectric layer 412b which is adjacent to the active layer 422b is cured while the part of the dielectric layer 412b which is adjacent to the active layer 422a remains non-cured.

The dielectric layer 412b stress characteristics, which results from the curing process 413, as disclosed above, induces tensile stress to the adjacent active layer 422b and the channel region of the NMOS structure 452b in a direction parallel to a surface of the substrate 410 (in-plane tensile stress). The tensile stress within the channel region, in turn, enhances electron mobility of the NMOS structure 452b.

In certain embodiments, the method 100 and the method 300 may continue with the formation of a 3-D device structure having a second and third semiconductor device stacked on the first semiconductor device. The second semiconductor device and the third semiconductor device include similar features and are formed in a similar manner as with the first semiconductor device, with the difference being that the second and third substrate includes a dielectric material isolating one device from the other.

Thus, provided is a method for manufacturing a semiconductor device. The method includes providing a substrate and forming a dielectric layer over the substrate. The method further includes forming a first trench within the dielectric layer, wherein the first trench extends through the dielectric layer and epitaxially (epi) growing a first active layer within the first trench and selectively curing with a radiation energy the dielectric layer adjacent to the first active layer.

In some embodiments the method may further comprise forming a second trench within the dielectric layer, wherein the second trench extends through the dielectric layer and epitaxially (epi) growing a second active layer within the second trench. The method further comprises forming a first seed layer interposed between the substrate and the first active layer and forming a second seed layer interposed between the substrate and the second active layer. In certain embodiments, forming the first seed layer and forming the second seed layer includes silicon (Si). In some embodiments, forming the second active layer includes silicon carbide (SiC). In further embodiments, forming the first active layer includes silicon germanium (SiGe). In some embodiments, the forming the dielectric layer includes silicon nitride (SiN). In certain embodiments, the selectively curing with a radiation energy the dielectric layer further comprises one of an ultraviolet curing, an electron beam curing, and a laser curing. Additionally, in various embodiments, the selectively curing with a radiation energy the dielectric layer operates to apply in plane tensile stress to the first active layer Also provided is a semiconductor device. The semiconductor device includes a substrate having a NMOS region and a PMOS region. The semiconductor device further includes a ultraviolet treated dielectric layer disposed over the substrate in the NMOS region of the substrate and a non-ultraviolet treated dielectric layer disposed over the substrate in the PMOS region of the substrate. Additionally, the semiconductor device includes a p-type epitaxial silicon active layer disposed over the substrate in the NMOS region of the substrate, wherein the p-type epitaxial silicon active layer is adjacent to at least one sidewall of the ultraviolet treated dielectric layer, and wherein the ultraviolet treated dielectric layer imparts a tensile stress within the p-type epitaxial silicon active layer; and a n-type epitaxial silicon active layer disposed over the substrate in the PMOS region of the substrate, wherein the p-type epitaxial silicon active layer is adjacent to at least one sidewall of the non-ultraviolet treated dielectric layer, and wherein the non-ultraviolet treated dielectric layer imparts a compressive stress within the n-type epitaxial silicon active layer.

In some embodiments, the semiconductor device further comprises a first seed layer interposed between the substrate and the p-type epitaxial silicon active layer and a second seed layer interposed between the substrate and the n-type epitaxial silicon active layer. In further embodiments, the ultraviolet treated dielectric layer comprises silicon nitride (SiN) and is configured to isolate the p-type epitaxial silicon active layer and the n-type epitaxial silicon active layer. In certain embodiments, the p-type epitaxial silicon active layer comprises silicon germanium (SiGe). In some embodiments, the n-type epitaxial silicon active layer comprises silicon carbide (SiC).

Also provided is an alternative embodiment of a method for manufacturing a semiconductor device. The method includes providing a substrate and forming a dielectric layer over the substrate, wherein the dielectric layer has a first stress characteristic. The method further includes curing portions of the dielectric layer, wherein the curing portions of the dielectric layer operates to change the stress characteristic of the cured portions of the dielectric layer from a first stress characteristic to a second stress characteristic, and wherein the first stress characteristic is different than the second stress characteristic. Additionally, the method includes forming a hard mask layer having an opening and forming a plurality of trenches by etching the dielectric layer and the substrate within the opening of the hard mask layer. The method also includes forming a seed layer over the substrate within the plurality of trenches and selectively epitaxially growing a first semiconductor material over the seed layer within a first plurality of trenches and selectively epitaxially growing a second semiconductor material over the seed layer within a second plurality of trenches.

In some embodiments, the dielectric layer includes silicon nitride (SiN). In certain embodiments, the first semiconductor material comprises silicon germanium (SiGe). In various embodiments, the second semiconductor material comprises silicon carbide (SiC). In one embodiment, the curing portions of the dielectric layer further comprises removing hydrogen from the dielectric layer. In some embodiments, the curing portions of the dielectric layer further comprises using a ultraviolet light.

The disclosed semiconductor device may be used in various applications such as digital circuit, imaging sensor devices, a hetero-semiconductor device, dynamic random access memory (DRAM) cell, a single electron transistor (SET), and/or other microelectronic devices (collectively referred to herein as microelectronic devices). Of course, aspects of the present disclosure are also applicable and/or readily adaptable to other type of transistor, including single-gate transistors, double-gate transistors, and other multiple-gate transistors, and may be employed in many different applications, including sensor cells, memory cells, logic cells, and others.

The above disclosure provides many different embodiments, or examples, for implementing different features of the invention. Specific examples of components and arrangements are described above to simplify the present disclosure. These are, of course, merely examples and are not intended to be limiting. Accordingly, the components disclosed herein may be arranged, combined, or configured in ways different from the exemplary embodiments shown herein without departing from the scope of the present disclosure.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method of manufacturing a semiconductor device, comprising:
    providing a substrate;
    forming a dielectric layer over the substrate;
    forming a first trench within the dielectric layer, wherein the first trench extends through the dielectric layer;
    epitaxially (epi) growing a first active layer within the first trench;
    selectively curing with a radiation energy the dielectric layer adjacent to the first active layer without directly exposing the first active layer to the radiation energy; and
    forming a first semiconductor device on the first active layer.

2. The method of claim 1 further comprising:
    forming a second trench within the dielectric layer, wherein the second trench extends through the dielectric layer;
    epitaxially (epi) growing a second active layer within the second trench; and
    forming a second semiconductor device on the second active layer.

3. The method of claim 2 further comprising forming a first seed layer interposed between the substrate and the first active layer and forming a second seed layer interposed between the substrate and the second active layer.

4. The method of claim 3 wherein forming the first seed layer and forming the second seed layer includes silicon (Si).

5. The method of claim 2 wherein forming the second active layer includes silicon carbide (SiC).

6. The method of claim 1 wherein forming the first active layer includes silicon germanium (SiGe).

7. The method of claim 1 wherein the forming the dielectric layer includes silicon nitride (SiN).

8. The method of claim 1 wherein the selectively curing with a radiation energy the dielectric layer further comprises one of an ultraviolet curing, an electron beam curing, and a laser curing.

9. The method of claim 1 wherein the selectively curing with a radiation energy the dielectric layer operates to apply in plane tensile stress to the first active layer.

10. A semiconductor device comprising:
    a substrate having a NMOS region and a PMOS region;
    a ultraviolet treated dielectric layer disposed over the substrate in the NMOS region of the substrate;
    a non-ultraviolet treated dielectric layer disposed over the substrate in the PMOS region of the substrate;
    a p-type epitaxial silicon active layer disposed over the substrate in the NMOS region of the substrate, wherein the p-type epitaxial silicon active layer is adjacent to at least one sidewall of the ultraviolet treated dielectric layer, and wherein the ultraviolet treated dielectric layer imparts a tensile stress within the p-type epitaxial silicon active layer; and
    a n-type epitaxial silicon active layer disposed over the substrate in the PMOS region of the substrate, wherein the n-type epitaxial silicon active layer is adjacent to at least one sidewall of the non-ultraviolet treated dielectric layer, and wherein the non-ultraviolet treated dielectric layer imparts a compressive stress within the n-type epitaxial silicon active layer.

11. The semiconductor device of claim 10 further comprising a first seed layer interposed between the substrate and the p-type epitaxial silicon active layer and a second seed layer interposed between the substrate and the n-type epitaxial silicon active layer.

12. The semiconductor device of claim 10 wherein the ultraviolet treated dielectric layer comprises silicon nitride (SiN) and is configured to isolate the p-type epitaxial silicon active layer and the n-type epitaxial silicon active layer.

13. The semiconductor device of claim 10 wherein the p-type epitaxial silicon active layer comprises silicon germanium (SiGe).

14. The semiconductor device of claim 10 wherein the n-type epitaxial silicon active layer comprises silicon carbide (SiC).

15. A method of manufacturing a semiconductor device, comprising:
    providing a substrate;
    forming a dielectric layer over the substrate, wherein the dielectric layer has a first stress characteristic;
    curing portions of the dielectric layer, wherein the curing portions of the dielectric layer operates to change the stress characteristic of the cured portions of the dielectric layer from a first stress characteristic to a second stress characteristic, and wherein the first stress characteristic is different than the second stress characteristic;
    forming a plurality of trenches by etching the dielectric layer;
    forming a seed layer over the substrate within the plurality of trenches;
    selectively epitaxially growing a first semiconductor material over the seed layer within a first plurality of trenches; and
    selectively epitaxially growing a second semiconductor material over the seed layer within a second plurality of trenches.

16. The method of claim 15 wherein the forming the dielectric layer includes silicon nitride (SiN).

17. The method of claim 15 wherein the forming the first semiconductor material includes silicon germanium (SiGe).

18. The method of claim 15 wherein the forming the second semiconductor material includes silicon carbide (SiC).

19. The method of claim 15 wherein the curing portions of the dielectric layer further comprises removing hydrogen from the dielectric layer.

20. The method of claim 15 wherein the curing portions of the dielectric layer further comprises using a ultraviolet light.

* * * * *